United States Patent [19]
Watanabe et al.

[11] Patent Number: 4,971,651
[45] Date of Patent: Nov. 20, 1990

[54] MICROWAVE PLASMA PROCESSING METHOD AND APPARATUS

[75] Inventors: Seiichi Watanabe; Makoto Nawata; Ryooji Fukuyama, all of Kudamatsu; Yutaka Kakehi; Saburo Kanai, both of Hikari; Keiji Ueyama, Goshogawara, all of Japan

[73] Assignee: Hitachi, Ltd., Tokyo, Japan

[21] Appl. No.: 475,266

[22] Filed: Feb. 5, 1990

[51] Int. Cl.$^5$ .................. B44C 1/22; C03C 15/00; C03C 25/06

[52] U.S. Cl. .................. 156/643; 156/646; 156/345

[58] Field of Search .................. 156/643, 646, 345; 204/192.32, 298; 118/715, 50.1, 620; 427/38, 39

[56] References Cited

FOREIGN PATENT DOCUMENTS

| | | |
|---|---|---|
| 62-40380 | 2/1987 | Japan . |
| 62-53920 | 11/1987 | Japan . |
| 0256433 | 11/1987 | Japan . |
| 1107538 | 4/1989 | Japan . |
| 1145814 | 6/1989 | Japan . |
| 1179323 | 7/1989 | Japan . |

*Primary Examiner*—William A. Powell
*Attorney, Agent, or Firm*—Antonelli, Terry, Stout & Kraus

[57] ABSTRACT

This invention relates to a microwave plasma processing method and apparatus.

An electromagnetic field intensity distribution of a microwave, which is incident into a plasma generation chamber and is again incident due to irregular reflection, is made uniform by uniforming means fixed inside a waveguide, a processing gas is converted to plasma by use of the microwave having the uniformed electromagnetic field intensity distribution, and a sample is plasma-processed by the resulting plasma. Accordingly, the electro-magnetic field of the microwave, which is incident, and is again incident, into the plasma generation region and locally increases a plasma density, is absorbed, attenuated or diffused by the uniforming means so that the distribution of the plasma density is made uniform and uniform processing can be effected.

20 Claims, 5 Drawing Sheets

MICROWAVE PLASMA PROCESSING METHOD AND APPARATUS

BACKGROUND OF THE INVENTION

1. Field of the Invention

This invention relates to a microwave plasma processing method and apparatus.

2. Description of the Prior Art

Conventional microwave plasma processing apparatuses are not free from the problem in that it is difficult to process uniformity a sample because non-uniformity of a microwave electromagnetic field intensity occurs in a reaction chamber due to a waveguide of a fixed shape or the like, or depending on the mode of microwave.

To solve the problem described above, Japanese Patent Laid-Open No. 40380/1987, for example, proposes a method which disposes microwave disturbance means such as a fan having the function of changing the relation between the electromagnetic field of microwave and a substrate inside a reaction chamber, makes uniform the integration, with respect to time, of the electromagnetic field intensity distribution of the microwave ejected into the reaction chamber and forms a uniform and homogeneous deposition film on the entire surface of the substrate. Japanese Patent Laid-Open No. 107538/1989 can be mentioned as a prior art reference of an equivalent type.

In a microwave plasma apparatus equipped with a magnetic field generation coil around the outer periphery of a discharge chamber. Japanese Patent Publication No. 53920/1987 discloses an apparatus which includes mode conversion means for converting the microwave to a circular polarization mode at an intermediate part of a waveguide, rotates a microwave electric field so as to make uniform the electric field intensity as well as the plasma density, and executes uniform etching and CVD. Japanese Patent Laid-Open No. 179323/1989 can be mentioned as a prior art reference of an equivalent type.

The prior art techniques described above make uniform time-wise the non-uniform distribution of the electric field intensity of the microwave and attempts to conduct uniform processing of a sample. Non-uniformity of the electric field intensity of the microwave results from the shape of the waveguide and from the electric field mode but the inventors of the present invention have found a new fact. The experiments carried out by the present inventors demonstrate clearly that the microwave introduced into a discharge tube to generate plasma is reflected by a plasma region or a sample table, this reflected microwave is reflected in a complicated manner in the waveguide and is incident once again into the plasma generation region to generate a high plasma density at part of the region. If such disturbance of the spatial distribution of the plasma density exists, there occurs the problem that the sample cannot be processed uniformly.

Japanese Patent Laid-Open No. 256433/1987 and Japanese Patent Laid-Open No. 145814/1989 can be cited as the prior art references associated with the present invention. Both of these prior art inventions prevent adhesion and deposition of reaction products by heating a discharge tube and an insulating container that define a processing chamber. The former disposes a microwave absorber below a sample position outside the discharge tube and the latter disposes a conductive thin film, to which electric power can be supplied, in the insulating container.

SUMMARY OF THE INVENTION

The object of the present invention is to provide a microwave plasma processing method and apparatus which can improve uniformity of processing when a sample is plasma-processed.

In an apparatus for converting a processing gas to plasma by use of a microwave inside a plasma generation chamber and processing a sample by the resulting plasma, the apparatus in accordance with the present invention is characterized in that means for making uniform an electromagnetic field intensity distribution of a microwave inside said plasma generation chamber by excluding part of microwaves which form a non-uniform portion of a plasma density inside the plasma generation chamber and the method in accordance with the present invention is characterized by a step of making uniform an electromagnetic field intensity distribution of a microwave inside said plasma generation chamber by excluding part of microwaves which form a non-uniform portion of a plasma density inside the plasma generation chamber. In other words, the apparatus and method of the present invention absorbs, attenuates or diffuses the electromagnetic field of the microwave which increases locally the plasma density due to its incidence and re-incidence into the plasma generation region by the uniforming means so as to make uniform the electromagnetic field intensity distribution of the microwave in the plasma and to improve uniformity of processing.

DESCRIPTION OF THE PREFERRED EMBODIMENTS

Hereinafter, a first embodiment of the present invention will be explained with reference to FIGS. 1 to 3.

Figure 1:
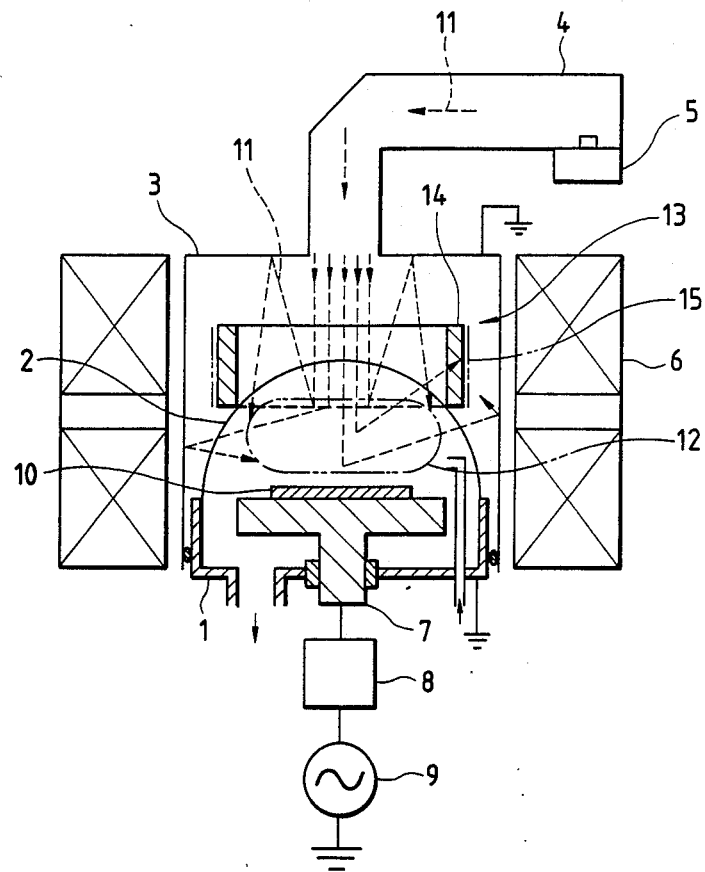
FIG. 1 is a schematic view showing a microwave plasma processing apparatus in accordance with one embodiment of the present invention.
Figure 2:
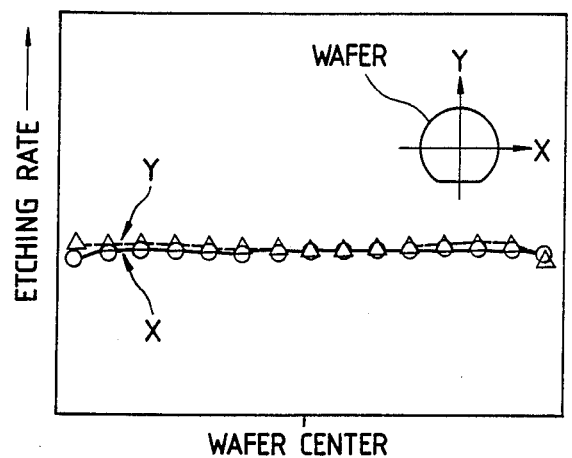
FIG. 2 is an explanatory view showing the etching rate distribution in the present invention.

FIG. 1 shows the outline of the microwave plasma-processing apparatus. A sample table 7 is disposed at a lower part of a processing chamber 1 and electrically insulated from it. A semispherical discharge tube 2 made of quartz is disposed at an upper part of the processing chamber to constitute the processing chamber 1. A processing gas can be supplied into the processing chamber 1 by an apparatus not shown in the drawing. The inside of the processing chamber 1 can be evacuated to a predetermined pressure by an exhaust apparatus not shown in the drawing. A waveguide 3 is disposed outside the discharge tube 2. Solenoids 6 is disposed outside the waveguide 3. Another waveguide 4 continues the upper part of the waveguide 3 and a microwave oscillator 5 is connected to the upper part of the waveguide 3 through the waveguide 4. A sample table 7 is connected to a radio frequency source 9 through a matching device 8. A ring-like absorber 13, which has its center in the direction of height at the top of the discharge tube 2 and which is 100 mm wide, is disposed at the upper part of the discharge tube 2 inside the waveguide 3, at least above the processed surface of a wafer 10 disposed on the sample table 7, that is, on the front side of the propagating direction of the microwave, in this case. The absorber 13 in this case is formed by depositing a tin oxide film 15 (0.5 $\mu$m thick in this case) to a quartz ring 14, and is the absorber of the microwave.

In the apparatus having the construction described above, the inside of the processing chamber 1 is evacuated to a reduced pressure and the processing gas is introduced into the processing chamber 1. The internal pressure of the processing chamber 1 is adjusted to a desired pressure. A magnetic field region is formed inside the discharge tube 2 by the solenoids 6. The microwave 11 is caused to be incident into the discharge tube 2 by the microwave oscillator 5 through the waveguides 4 and 3. When the microwave 11 is caused to be incident into this magnetic field inside the discharge tube 2, plasma 12 of the processing gas is generated inside the discharge tube 2. The resulting plasma 12 processes, or etches in this case, the wafer 10 placed on the sample table 7. In this case, radio frequency power is applied to the sample table 7 through the matching device 8 in order to control the etching shape of the wafer 10.

Since the absorber 13 is disposed at the upper part of the discharge tube 2, part of the microwave 11 propagating and coming into the waveguide 3 and part of the microwave 11 reflected by the plasma 12 generated inside the discharge tube 2 or by the sample table 7 or the like are absorbed by tin oxide 15 of the absorber 13. Part of these microwaves 11 is the microwave which is incident or incident once again into the region of the plasma 12 and generates locally a high plasma density. The rest of the microwaves 11 are incident, or once again incident, into the region of the plasma 12 and contribute to the generation of plasma. In this manner, if the absorber 13 is disposed above the processed surface of the wafer 10, part of the microwave propagating in such a manner as to generate the plasma having locally a high density can be absorbed and excluded and the propagation of part of such microwaves can be disturbed. Therefore, the microwave electromagnetic filed intensity distribution inside the discharge tube 2 and in more detail, in the region of the plasma 12, becomes uniform and the density of the plasma 12 generated in the discharge tube 2 can be made uniform.

For example, the etching rate of the wafer 10, when etching of a silicon dioxide film was made by use of a 6-in wafer, was examined under the condition where $CHF_3$ was used as the processing gas, its flow rate was 50 cc/min, the internal pressure of the processing chamber was 10 mTorrs, a 2.45 GHz microwave was applied at 1 KW and 800 KHz radio frequency power was applied at 100 W. It was found, as shown in FIG. 2, that the etching rate was substantially uniform in both X- and Y-directions of the wafer.

Figure 3:
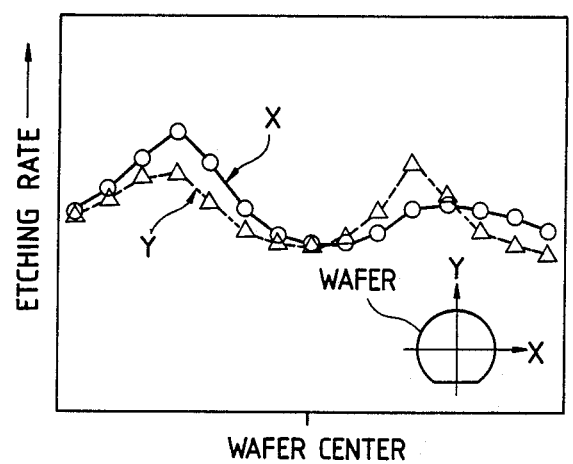
FIG. 3 is an explanatory view showing the etching rate distribution in a prior art example.

When etching was carried out under the same condition as described above but not using the absorber 13, the etching rate was low at the center and outer peripheral portions of the wafer in both of its X- and Y-directions and became high between them as shown in FIG. 3. Thus, the etching rate was non-uniform as a whole.

Incidentally, the detailed arrangement position of the absorber 13 above the processed surface of the wafer 10 in this case, that is, in front of the sample surface on the propagating side of the microwave, varies with the apparatus depending on the shape of the waveguide 3, the discharge tube 2, and the like, and the optimum position must be therefore confirmed every time.

In accordance with the first embodiment of the present invention described above, part of the microwave in the waveguide 3 among those which are incident into the discharge tube 2, which locally increases the plasma density inside the discharge tube 2, can be absorbed by the absorber 13 or more in detail, by the tin oxide film 15. Accordingly, the plasma density inside the discharge tube 2 can be made uniform and uniformity of wafer processing can be improved.

Since the absorber 13 is disposed outside the discharge tube 2, the absorber 13 is not damaged by the plasma, in other words, the plasma is not contaminated by the absorber 13.

Though the apparatus is of a vertical type in this embodiment, the effect of the invention is the same also in a horizontal type.

Though this embodiment uses tin oxide which is a conductive loss material, or a resistance material, as the absorbing material of the microwave, other conductive loss materials such as indium oxide, carbon, carbon-containing materials, their mixtures, or dielectric loss materials such as water, barium titanate, etc, or magnetic loss materials such as ferrite, ferrite-containing materials, etc, may be used.

Figure 4:
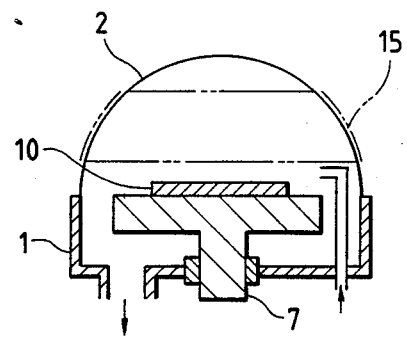
FIG. 4 is a sectional view showing another example of an absorber shown in FIG. 1.

Furthermore, it is possible to extend the upper part of the absorber 13 to the waveguide 3 and to directly fit it to the waveguide 3. The tin oxide film 15 may be directly deposited to the outer surface of the discharge tube 2 as shown in FIG. 4. Furthermore, it is effective to dispose the film 15 on the inner wall surface of the waveguide 3. Incidentally, these arrangement positions of the absorber are effectively on the upstream side of the processed surface of the wafer 10 at least at the front portion of the propagation direction of the microwave as shown in FIGS. 1 and 4 or in other words, on the upstream side of the upper interface of the plasma generation region (that is, the interface of the plasma generation region on the upstream side of the position of the wafer 10). It is effective, for example, to dispose the absorber on the upper side of the fitting position on the outer surface of the discharge tube 2 as shown in FIG. 4, that is, on the upper side towards the upper space of the discharge tube 2.

Figure 5:
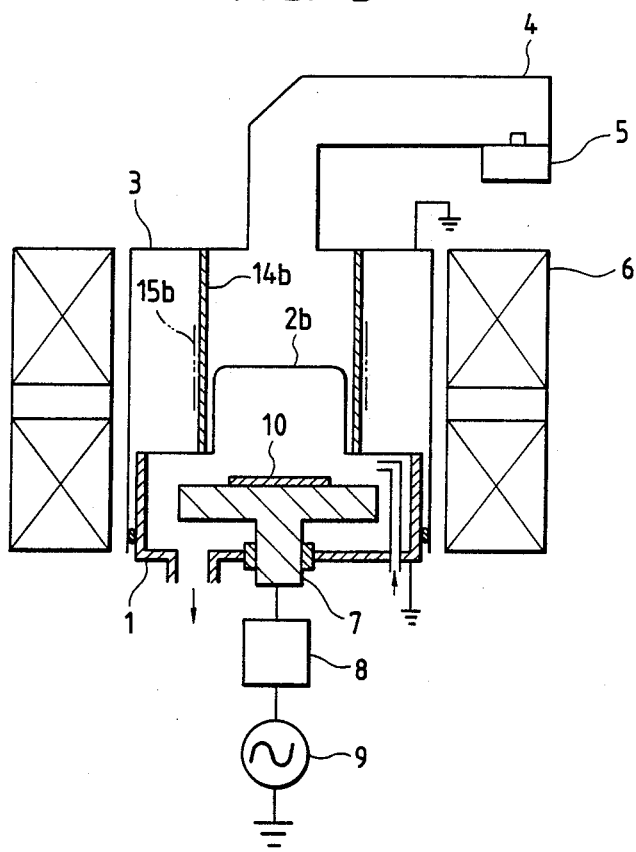
FIG. 5 is a schematic view showing a microwave plasma processing apparatus having a changed shape of a discharge tube shown in FIG. 1.

Incidentally, the optimum position of the microwave absorber was examined by use of a microwave processing apparatus having a silk hat-shaped discharge tube 2b as shown in FIG. 5. In this drawing, like reference numerals are used to identify like constituents as in FIG. 1 and their explanation is omitted. In this apparatus, a quartz cylinder 14b was disposed outside the discharge tube 2b and a polyimide film 15b prepared by vacuum evaporation of indium oxide as a microwave absorber was bonded around the periphery of the cylinder 14b. Vacuum evaporation of indium oxide in this case was made by sputtering and a sheet resistance was set to be 377 Ω/square. This was because the characteristic impedance in vacuum and in air was about 377Ω and the microwave could be absorbed most efficiently when the sheet resistance of the resistance film was in agreement with this impedance.

In the apparatus described above, the silicon dioxide film was etched under the same condition as in the embodiment described above by changing the size and fitting position of the polyimide film 15b as the microwave absorber. The result is shown in FIGS. 6 and 7.

Figure 6:
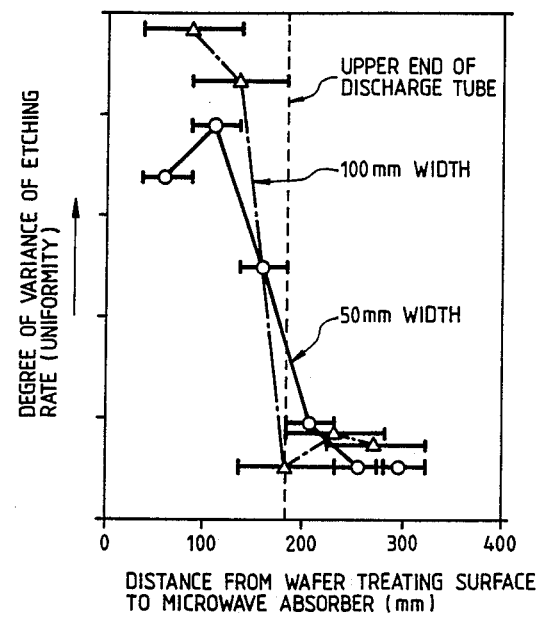
FIG. 6 is a diagram showing the relationship between the position of height of a microwave absorber in the apparatus shown in FIG. 5 and the degree of variance of the etching rate uniformity.

FIG. 6 is a diagram showing the relationship between the distance from the upper surface of the wafer 10 to the center of the polyimide film 15b and the degree of variance of the etching rate uniformity. In this diagram, solid line represents the case where the width of the polyimide film 15b is 50 mm and one-dot-chain line represents the case where the width of the polyimide film 15b was 100 mm. Dotted line represents the upper end position of the discharge tube 2b. It can be understood from FIG. 6 that uniformity could be improved when the Kapton film 15b or the microwave absorber was disposed in such a manner that at least its upper end projected upward from the upper end of the discharge tube.

Figure 8:
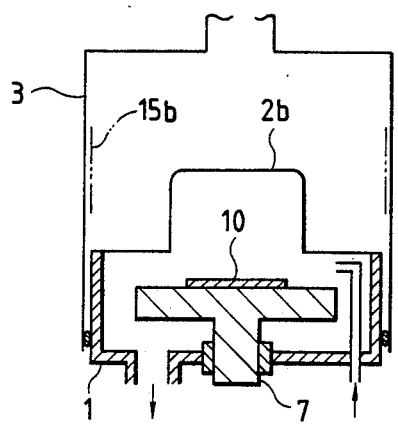
FIG. 8 is a schematic view showing another example of the absorber portion shown in FIG. 5.
Figure 7:
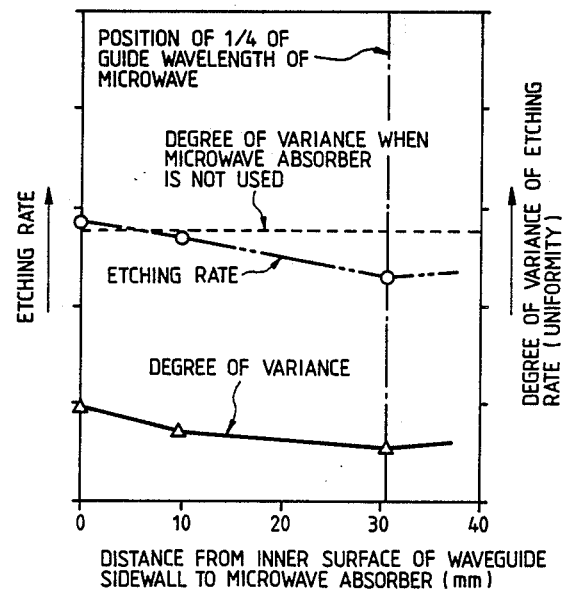
FIG. 7 is a diagram showing the relationship between the position of the microwave absorber in a radial direction in the apparatus shown in FIG. 5, the degree of variance of the etching rate uniformity and the etching rate.

FIG. 7 is a diagram showing the relationship between the distance from the inner surface of the sidewall of the waveguide 3 to the polyimide film 15b and the degree of variance of the etching rate uniformity. In the drawing, the polyimide film 15b was 100 mm wide. Solid line represents the degree of variance of the etching rate uniformity and two-dot-chain line represents the etching rate. Dash line represents the degree of variance of the etching rate uniformity when the microwave absorber was not used and one-dot-chain line represents a ¼ position the guide wavelength of the microwave. It can be understood from FIG. 7 that uniformity was improved when the distance from the inner surface of the sidewall of the waveguide 3 to the microwave absorber came closer to the ¼ distance of the guide wavelength of the microwave. It can be understood, too, that even when the microwave absorber (the polyimide film 15b in this case) was disposed on the inner surface of the sidewall of the waveguide 3 as shown in FIG. 8, uniformity could be improved by far greatly than when it was not used. However, the etching rate dropped by the degree corresponding to the improvement of uniformity due to absorption of the microwave. Incidentally, the degree of variance when the microwave absorber was disposed on the inner surface of the sidewall of the waveguide 3 was about ⅓ of the degree of variance when the microwave absorber was not used.

Figure 9:
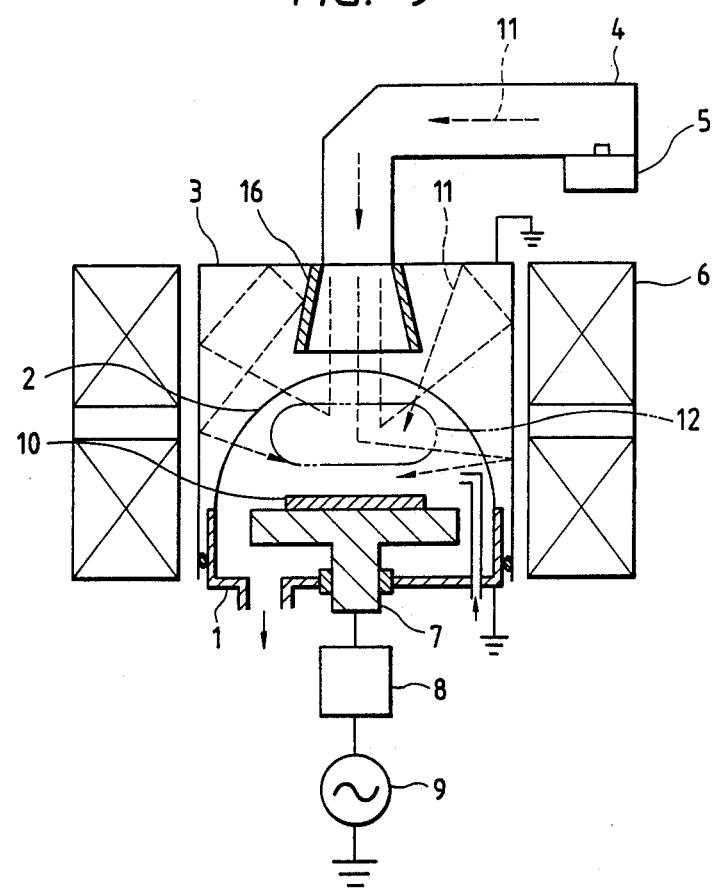
FIG. 9 is a schematic view showing a microwave plasma processing apparatus in accordance with the second embodiment of the present invention.

Next, the second embodiment of the present invention will be explained with reference to FIG. 9.

In the drawing, like reference numerals are used to identify like constitutents as in FIG. 1 and their explanation will be omitted. The difference of this drawing from FIG. 1 resides in that a reflector 16 for reflecting and dispersing the microwave is disposed above the discharge tube 2 in place of the absorber 13 as the means for making uniform the electromagnetic field intensity distribution of the microwave inside the discharge tube shown in FIG. 1. The reflector 16 in this case is a conical tube made of aluminum and is fitted to the waveguide 3. The reflector 16 is grounded through the waveguide 3.

When the plasma is generated by the apparatus having the construction described above in the same way as in the first embodiment, part of the microwave 11 propagating and coming into the waveguide 3 and part of the microwave reflected by the plasma generated inside the discharge tube 2 or by the sample table 7 or the like impinge against the reflector 16 and are reflected and dispersed by it. Part of these microwaves is the microwave which is incident, and again incident, into the plasma region 12 and generates locally a high plasma density. The rest of the microwaves are incident an again incident into the plasma region 12 together with the microwave reflected and dispersed by the reflector 16 and contribute to the generation of plasma. In this case, since the reflector 16 is disposed on the processed surface of the wafer 10, part of the microwave which propagates and otherwise generates locally a high density plasma can be reflected, dispersed and excluded. Furthermore, since the propagation of part of such microwaves can be disturbed, the electromagnetic field intensity distribution inside the discharge tube 2, or in more detail, in the plasma region 12, can be made uniform and the density of the plasma 12 generated inside the discharge tube 2 can be made uniform. Incidentally, since the reflector 16 is grounded, it is not induced by the microwave electric field and can therefore reflect the microwave reliably.

In accordance with the second embodiment of the present invention described above, part of the microwave which increases locally the plasma density of the discharge tube 2 among those microwaves 11 inside the waveguide 3 which are incident into the discharge tube 2 can be reflected and dispersed by the reflector 16. Accordingly, the plasma density inside the discharge tube 2 can be made uniform and uniformity of the wafer processing can be improved, without to be decreased energy of microwave.

Since the reflector 16 is disposed outside the discharge tube 2, the reflector 16 is not damaged by the plasma, in other words, the plasma is not contaminated by the reflector 16. Incidentally, the size, shape, fitting position, etc, of the reflector 16 vary with the apparatus depending on the shape of the waveguide 3 and the like. Accordingly, the optimum shapes, etc, must be selected everytime.

Figure 10:
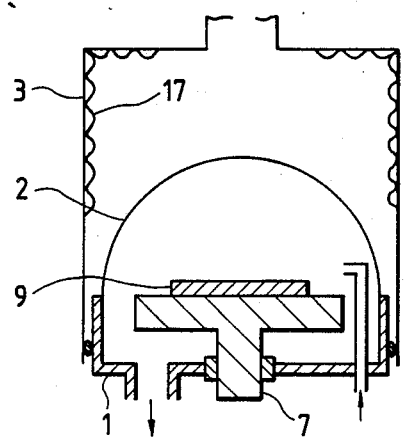
FIG. 10 is a schematic view showing another example of the reflector portion shown in FIG. 9.

In the second embodiment, the taper-like tubular reflector is fitted to the waveguide 3 but a corrugated reflector 17 may be fitted to the inner surface of the waveguide 3 as shown in FIG. 10. Incidentally, the corrugation may be mountain-like or wave-like and is disposed either continuously or discontinuously depending on cases.

Furthermore, the waveguide 3 in the foregoing embodiments uses an increased diameter tube having a discontinuous sectional area, but it may be a taper-like increased diameter tube having a continuously changing section.

Though the foregoing embodiments represent the magnetic field microwave plasma processing apparatus using the solenoids 6, the apparatus may not use the magnetic field.

Though the foregoing embodiments represent forming the generating region of plasma 12 in the processing chamber 1, the generating region of plasma 12 may be separated a from processing space in the processing chamber 1.

Though the foregoing embodiments represent etching as plasma processing, it may be CVD or sputter processing. Uniform processing of the sample becomes possible by making uniform the plasma density in the manner described above.

Furthermore, these absorber and reflector may of course be used independently, but the electromagnetic field intensity can be made uniform by use of them in combination.

As described above, the present invention provides the effect that uniformity of processing can be improved when plasma processing of a sample is conducted.

What is claimed is:

1. A microwave plasma processing method comprising a step of converting a processing gas to plasma by use of a microwave inside a plasma generation chamber, a step of treating a sample by using said plasma, and a step of making uniform an electromagnetic field intensity distribution of a microwave inside said plasma generation chamber by excluding part of microwaves which form a non-uniform portion of a plasma density inside said plasma generation chamber.

2. A microwave plasma processing apparatus for converting a processing gas to plasma by use of a microwave and processing a sample by said plasma, comprising uniforming means for making uniform an electromagnetic field intensity distribution of a microwave, which is incident into a plasma generation chamber and is again incident thereinto due to irregular reflection, inside said plasma generation chamber, said uniforming means being fixedly disposed inside a waveguide.

3. A microwave plasma processing apparatus according to claim 2, wherein said uniforming means consists of a member for absorbing said microwave or a member for reflecting said microwave or their combination.

4. A microwave plasma processing apparatus according to claim 3, wherein said microwave absorbing member is a resistor film.

5. A microwave plasma processing apparatus according to claim 3, wherein said microwave absorbing member is an electrically conductive film formed by disposing a resistor film on a film.

6. A microwave plasma processing apparatus according to claim 5, wherein said resistor film has a resistance value of a sheet resistance of near 377 $\Omega$/square and near.

7. A microwave plasma processing apparatus according to claim 5, wherein said resistor film is made of tin oxide, indium oxide, carbon or their mixtures.

8. A microwave plasma processing apparatus according to claim 3, wherein the upper end of said microwave absorbing member is disposed at least above an upper interface of a plasma generation region.

9. A microwave plasma processing apparatus according to claim 3, wherein said microwave absorbing member is disposed on the inner surface of the sidewall of said waveguide.

10. A microwave plasma processing apparatus according to claim 9, wherein said microwave absorbing member is disposed between the inner surface of the sidewall of said waveguide and a position having a distance of $\frac{1}{4}$ of the guide wavelength of said microwave.

11. A microwave plasma processing apparatus according to claim 3, wherein said microwave absorbing member is disposed at, or near, a position having a distance of $\frac{1}{4}$ of the guide wavelength of said microwave from the inner surface of the sidewall of said waveguide.

12. A microwave plasma processing apparatus according to claim 3, wherein said microwave reflecting member is grounded.

13. A microwave plasma processing apparatus comprising a plasma generation chamber, evacuating means for evacuating the plasma generation chamber so as to reduce an internal pressure thereof, gas supplying means for supplying a processing gas into the plasma generation chamber, plasma formation means for converts the processing gas which supplied into the plasma generation chamber to plasma, means for excluding part of microwaves which form a non-uniform portion of a plasma density inside the plasma generation chamber.

14. A microwave plasma processing apparatus for converting a processing gas by use of a microwave and plasma-processing a sample, comprising microwave absorbing means disposed in front of a position of a sample surface inside a microwave propagation space between a waveguide and a discharge tube and in a microwave propagating direction.

15. A microwave plasma processing apparatus according to claim 14, wherein said microwave absorbing means is ring-like.

16. A microwave plasma processing apparatus according to claim 14, wherein said microwave absorbing means is deposited as a film onto the outer surface of said discharge tube.

17. A microwave plasma processing apparatus according to claim 14, wherein said microwave absorbing means is deposited as a film onto the inner surface of the sidewall of said waveguide encompassing said discharge tube.

18. A microwave plasma processing apparatus for converting a processing gas by use of a microwave and plasma-processing a sample, comprising microwave reflecting means disposed in front of a position of a sample surface inside a microwave propagation space between a waveguide and a discharge tube and in a microwave propagating direction.

19. A microwave plasma processing apparatus according to claim 18, wherein said microwave reflecting means is a conical tube.

20. A microwave plasma processing apparatus according to claim 18, wherein said microwave reflecting means is disposed on the inner wall surface of said waveguide encompassing said discharge tube.

* * * * *